(12) United States Patent
Yates et al.

(10) Patent No.: US 6,270,645 B1
(45) Date of Patent: Aug. 7, 2001

(54) SIMPLIFIED PROCESS FOR PRODUCTION OF ROUGHENED COPPER FOIL

(75) Inventors: Charles B. Yates, Princeton; Adam Wolski, Edgewater; George Gaskill, Manahawkin, all of NJ (US); Chinsai T. Cheng, Orange, CT (US); Keith Bodendorf, Westhampton, NJ (US); Paul Dufresne, Langhorne, PA (US)

(73) Assignee: Circuit Foil USA, Inc., Bordentown, NJ (US)

( * ) Notice: Subject to any disclaimer, the term of this patent is extended or adjusted under 35 U.S.C. 154(b) by 0 days.

(21) Appl. No.: 08/938,156

(22) Filed: Sep. 26, 1997

(51) Int. Cl.$^7$ ............................... C25D 1/04; C25D 5/10
(52) U.S. Cl. ..................... 205/77; 205/138; 205/141; 205/142; 205/177; 205/178; 205/182
(58) Field of Search ................................ 205/50, 76, 77, 205/138, 141, 142, 177, 178, 182; 428/606, 607, 658, 675, 687, 935

(56) References Cited

U.S. PATENT DOCUMENTS

| | | | |
|---|---|---|---|
| 3,293,109 | 12/1966 | Luce et al. | 428/556 |
| 3,857,681 | 12/1974 | Yates et al. | 428/554 |
| 3,918,926 | 11/1975 | Wolski et al. | 428/601 |
| 4,549,940 | 10/1985 | Karwan | 205/50 |
| 4,956,053 | * 9/1990 | Polan et al. | 304/13 |
| 5,215,646 | 6/1993 | Wolski et al. | 205/77 |
| 5,447,619 | 9/1995 | Wolski et al. | 205/50 |
| 5,482,784 | * 1/1996 | Ohara et al. | 428/607 |
| 5,792,333 | * 8/1998 | Oguro et al. | 205/103 |

FOREIGN PATENT DOCUMENTS 1042761    9/1966   (GB).

OTHER PUBLICATIONS

Dini, "Influence on Leveling", Electrodeposition, The Materials Science of Coatings and Substrates, p. 203, 1993. month of publication not available.

Lowenheim, "Fundamental Principles", Modern Electroplating, p. 32, 1974. month of publication not available.

Bunshah et al., "Deposition Technologies For Films and Coatings", p. 396, 1982. month of publication not available.

* cited by examiner

Primary Examiner—Kathryn Gorgos
Assistant Examiner—William T. Leader
(74) Attorney, Agent, or Firm—Finnegan, Henderson, Farabow, Garrett & Dunner, L.L.P.

(57) ABSTRACT

A simplified process and apparatus for electrodepositing a bond-enhancing copper treatment layer on a surface of copper foil, preferably wherein a single treatment layer is uniformly applied on raw copper foil using a current density of from about 40 to about 100 A/ft$^2$, a plating time of greater than 30 seconds, and the electrolyte is a copper sulfate-sulfuric acid solution containing arsenic, chloride ions and 2 imidazalidinethione. The raw foil is transferred to a station for applying the treatment directly from a rotating drum cathode machine on which it is produced, at the same speed at which the raw foil is produced, and then to a barrier layer station, a stainproofing station and a chemical adhesion promoter station, after which it is dried and coiled.

9 Claims, 5 Drawing Sheets

SIMPLIFIED PROCESS FOR PRODUCTION OF ROUGHENED COPPER FOIL

FIELD OF THE INVENTION

Our invention relates to copper foil having a micro-roughening bond-enhancing copper treatment electrodeposited on a surface thereof, and, more particularly, it relates to a simplified process and apparatus for the production of such foil and to copper foil produced thereby.

BACKGROUND OF THE INVENTION

By the early 1970's, the copper foil industry had universally adopted a methodology of producing treated copper foil which separated the manufacture of the so called "raw" copper foil (electrodeposited on rotating drum cathodes) and the electrodeposition on such copper foil of a bond-enhancing "treatment", usually electrodeposited in multiple treater tanks or treaters. These distinctly separate manufacturing steps are now established within the world-wide copper foil industry and are enshrined within ever increasingly sophisticated equipment and process engineering. The output of such machines used in the printed circuit board (PCB) industry has also increased per individual unit, as the electric current applied to cathodes used in raw foil manufacture has more than doubled, and the increased output has driven the development of faster and faster running treaters. Simultaneously with this evolution the typical thickness of copper foil used in the industry has been reduced and continues to reduce.

These industry wide developments have created a situation where installed capacity is focused on larger and larger manufacturing plants which are increasingly inflexible in the range of products they can produce.

Because of the increased output per unit, copper foil production machinery is usually set up to run continuously on one grade of product. Any changes required to produce different products are costly in down time and are avoided where possible. It is also the case that high speed treaters need large rolls of copper from the drums to take advantage of their throughput potential. Rolls in excess of three thousand pounds are commonplace, and for such rolls of a typical substance weight of one ounce per square foot and 55 inches wide, it takes about 8.7 hours to provide the raw foil with the treatment in a treating machine at 20 ft/min, but only about 2.2 hours at 80 ft/min.

Traditional methods of providing copper foil with a bond-enhancing treatment consist of a sequentially applied plurality of electrodeposited layers. Usually, the first layer is electrodeposited on the matte side (side facing the electrolyte) of a roll of raw foil, such electrodeposit creating a dendritic layer whose role is to increase the true surface area, which in turn enhances the foil's "bondability" to typical polymeric base materials. The dendritic layer, is usually followed by a "gilding" layer of pure copper metal, then a "barrier" layer, and finally a stain proof layer. The details of such processes are disclosed, by way of example, in U.S. Pat. Nos. 3,857,681 (Yates, et al.), and 3,918,926 (Wolski, et al.).

Generally, it can be said that first two steps of the treatment (usually executed in four consecutive plating stages) change the micro-topography of the matte side of the foil, while the remaining steps, barrier layer and stain proof layer, change the chemistry of the surface by virtue of the application of micro layers that render the properties of the bonding treatment durable and resistant to various forms of corrosion. The bonding treatment operation is conducted in machines, called "treaters", wherein rolls of raw foil are unrolled in a continuous manner and fed into the treater by means of driven rollers (similar to the way in which a web of paper is handled in a printing machine), rendered cathodic by means of cathodic contact rollers and passed in a serpentine fashion through a plurality of plating tanks, facing, in each tank, a rectangular anode. Each tank has its own supply of appropriate electrolyte and its D.C. power source. Between the tanks, the foil is thoroughly rinsed on both sides. The purpose of this operation is to electrodeposit on at least one side of the foil, usually the matte side, micro-projections of complex shape, which ensure that the foil will be firmly anchored to the base polymeric materials used in fabricating the copper clad laminates.

In order to handle a very thin copper foil in the manner described above, treater machines must be heavily engineered. They are equipped with sophisticated web tension control devices that must maintain uniform tension through the varying temperatures in the plating tanks which expand and contract the foil. Such control systems match roll speeds to the varying length of the web and are essential to avoid slippage and creasing of the foil. All path rolls must be precisely machined, particularly the "contact rolls" which pass electric current into the copper foil. Consequently, treater machines, built by specialized engineering companies have become increasingly expensive and can cost in excess of $10 million per treater.

Because of the inherently high investment cost of such treaters, they are designed to operate at high speeds, for example up to 150 ft per minute. In contrast, the speed of the raw foil produced on the rotating drum machine is much slower, and can be about 5 ft/min. for one ounce foil (such speed being dependent on the applied current and the drum diameter and width).

In a typical foil manufacturing plant, therefore, one treater has to "serve" the output of many drum machines. Those skilled in the art have thought that increasing the speed on such equipment can only be done by balancing the requirements of linear speed with commensurately adjusted process parameters. To achieve any defined character of electrodeposit on the copper foil obviously requires that a certain current density to be applied for a certain time in any given bath if the anode size remains constant. Increasing web speed on a treater clearly reduces the "plating time" which is the amount of time a point on the foil is exposed to the anode. Similarly, any compensating increase in applied current will change the nature of the crystals formed at the point of deposition because of the increase in current density. Plating time can be increased by having deeper tanks and longer anodes, but the stability of the web as it passes through the individual plating tanks is threatened once the unsupported length of the web on the down pass is greater than the width supported by the path rollers. Controlling these factors adds enormously to the cost of the modem breed of treating machines.

The present inventions substantially avoids the problems outlined above and provides a uniquely novel method for optimizing the desired treating conditions in a way hitherto impossible by conventional means.

To explain how the invention makes these improvements possible first requires an explanation of how the objectives of copper foil treatments are presently achieved and how they are improved by the present invention.

The first treatment layer is a dendritic deposit whose role is to increase the foil's true surface area and thus promote good "bondability".

In its travel through the dendritic deposit process tank, foil typically passes in front of one or two rectangular anodes disposed parallel to the foil path and each being of a length calculated to provide a dwell time appropriate to the speed of the web and the plating time required. The actual deposition time for this stage of the treatment may be only between four or eight seconds. In order to deposit a mass of treatment that offers bondability, within such a short deposition time, it is customary to use very high current densities, corresponding to the limiting current density of the treatment process. Moreover, the limiting current density assures formation of dendritic deposits that are good for bondability.

Such an approach to the bonding treatment process is not only expensive (cost of the treaters, losses of production due to the "handling" of delicate foil by long and complex treater machines which can easily cause wrinkles, scratches, etc.), but also produces a treatment structure that is "high profile". This is because the high-speed treater line, combined with high current density, creates mass transfer conditions at the foil-electrolyte interface which in turn leads to the distribution of treatment over the micro-profile of the base (raw) foil in a manner which favors the peaks and neglects the valleys. Peaks are thus "overcrowded" with the bonding treatment at the expense of the valleys. This is an undesirable condition of so-called poor micro-throwing power and can, therefore, be responsible for degraded dielectric properties in PCBs made with such material.

Treatment with overly high micro-projections concentrated on the peaks of base foil is a poor raw material for fabrication of printed circuits. The cross-section of the foil is chain-saw like, with "teeth" that penetrate very deeply into polymeric substrates. Consequently, this increases the time necessary to etch away unwanted copper, the particles of copper tend to remain deeply embedded in the resin, affecting unfavorably dielectric properties of printed circuit boards and diminishing layer to layer dielectric thickness in the fabrication of multi-layer printed circuit boards.

We have determined that a reverse of the above-described condition, a good micro-throwing power, is desirable, in the electrodeposition of bonding treatment. This can be achieved if the treatment's microprojections, instead of overcrowding micropeaks, descend deeper toward the micro-valleys. Good bonding ability is achieved not by excessive height of the treatment at the peak, but by better distribution of the individual treatment particles (microprojections). If the height of microprojections is decreased, but their number increases, the bonding ability of the foil will remain the same, but such foil will be endowed with more desirable characteristics, namely low profile.

We have found that the shortcomings of the existing treatment process can be improved if the micro-roughening steps of the treatment are conducted under the conditions of low current density, long deposition time, and in the presence of a specific addition agent, so as to achieve uniform distribution of the treatment layer on the surface of the new foil.

Surprisingly, under such conditions, i.e., where conditions of the mass transfer are drastically different from the mass transfer occurring in the traditional treatment process, the need for a dendritic or powdery stage of the treatment followed by the gilding layer stage, is eliminated.

The one step micro-roughening treatment we have discovered, especially when electrodeposited on the matte side of the base foil, has a structure which enhances the true surface area and thus promotes good "bondability". The treatment particles are also quite hard and mechanically resilient. Furthermore, the treatment particles are evenly distributed over the micro-profile of the base foil, that is, in the valleys as well as on the peaks. This means that the treatment particles are no longer peak orientated, but are much more uniformly distributed on the slopes and in the valleys. Thus the treatment combines the desideratum of lower profile with excellent bondability.

This simplified one-station treatment can only practically be applied at the slow speeds that are a feature of the present invention.

In our simplified foil machine, the raw foil emerging from the rotating drum section is guided into and through the first treating tank (station) with the micro-roughening electrolyte and passed before a pair of rectangular anodes (each 20 to 40 inches long). The electrodeposition of the treatment is delivered with a current density of from about 40 up to 100 A/ft$^2$.

After completion of the micro-roughening step, the foil can be guided directly through a sequence of a barrier layer applying station (U.S. Pat. No. 3,857,681), a stainproofing station (U.S. Pat. No. 5,447,619) and a spray of chemical adhesion promoter.

Only in the present invention is it practical to adopt the improved technology described above, as it is only at the web speeds associated with raw foil production that there is sufficient time to operate a low current density micro-roughening process that produces a low profile, high density deposit as described above. Also, since the foil path in one-step drum-treater machine is much shorter than in a traditional treater machine, production losses are minimized, while the cost of one-step machine is only a fraction of that of traditional treater machines.

A further advantage of the present simplified foil production unit is that it eliminates the need for unwinding and winding the rolls of foil two times over, thus further reducing production losses. It also allows short runs of specialty products and can be equipped with in-line sheeting capability.

SUMMARY OF THE INVENTION

A primary object of he present invention is to overcome the disadvantages of the afore-mentioned copper foil manufacturing apparatus and method and to reduce the costs of manufacture while simultaneously enhancing the quality of the copper foil and the versatility of the production method.

Another object is to provide an improved method and apparatus for manufacturing high grade copper foil by combining the present, i.e., raw foil manufacture and application of treatment, stages of manufacture into a single manufacturing unit.

A further object is a simplified process for applying a micro-roughening treatment to raw copper foil which enables the application on the foil of a single electrodeposited layer of copper which provides good bondability to a polymeric substrate.

Other objects and advantages of the invention may become apparent form the following description and through practice of the invention.

The objects of the invention may be achieved by a process for the production of electrodeposited copper foil having an electrodeposited copper bonding treatment on a surface of raw foil for enhancing the bondability of the foil to a polymeric substrate, which comprises passing a web of raw electrodeposited copper foil to a treater tank containing an anode immersed in a copper sulfate-sulfuric acid electrolyte;

passing the copper foil through the electrolyte while passing an electric current from the anode through the electrolyte to the copper foil to electrodeposit a micro-roughening copper layer on a surface of the copper foil, the copper layer being electrodeposited under electrodeposition conditions which include a current density of from about 40 to about 100 A/ft$^2$ and a plating time of greater than 30 sec.

Preferably, the above process further includes electrodepositing raw copper foil on a rotating drum cathode, passing the raw foil directly to a barrier layer tank, electrodepositing a zinc-containing barrier layer on the electrodeposited copper layer in the barrier layer tank, passing the foil having the barrier layer thereon from the barrier layer tank directly to a stainproofing tank, and electrodepositing a chromium-containing stainproofing layer on the barrier layer.

The present invention also provides an apparatus for producing electrolytic copper foil having a surface providing good peel strength when bonded to a polymeric substrate, which apparatus comprises: a rotating drum-cathode machine for producing raw copper foil; a treater station for electrodepositing a single micro-roughening copper layer on a surface of the raw foil; first transfer means between the drum-cathode machine and the treater station for transferring produced raw copper foil from the drum-cathode machine directly to the treater station; a barrier layer station for electrodepositing a zinc-containing barrier layer on the treatment layer; second transfer means between the treater station and the barrier layer station for transferring copper foil having the copper layer thereon from the treater station directly to the barrier layer station; a stainproofing station for electrodepositing a chromium-containing stainproofing on the barrier layer, and third transfer means between the barrier layer station and the stainproofing station for transferring copper foil having the treatment and the barrier layer thereon from the barrier layer station directly to the stainproofing station.

In one embodiment of the invention, the micro-roughening copper layer is applied as the matte side (electrolyte side) of the raw foil in the treater station. And, preferably, the treater station is provided with at least a first anode and a second anode for electrodepositing a micro-roughening copper layer on both the matte side and the shiny side (the drum side) of the raw foil, with the barrier layer and stainproofing layers electrodeposited on the matte side, to produce a foil suitable for use in the production of multi-layer PCB's.

BRIEF DESCRIPTION OF THE DRAWINGS

The present invention is described hereinbelow with reference to the accompanying drawings wherein.

DESCRIPTION OF PREFERRED EMBODIMENTS OF THE INVENTION

Figure 1:
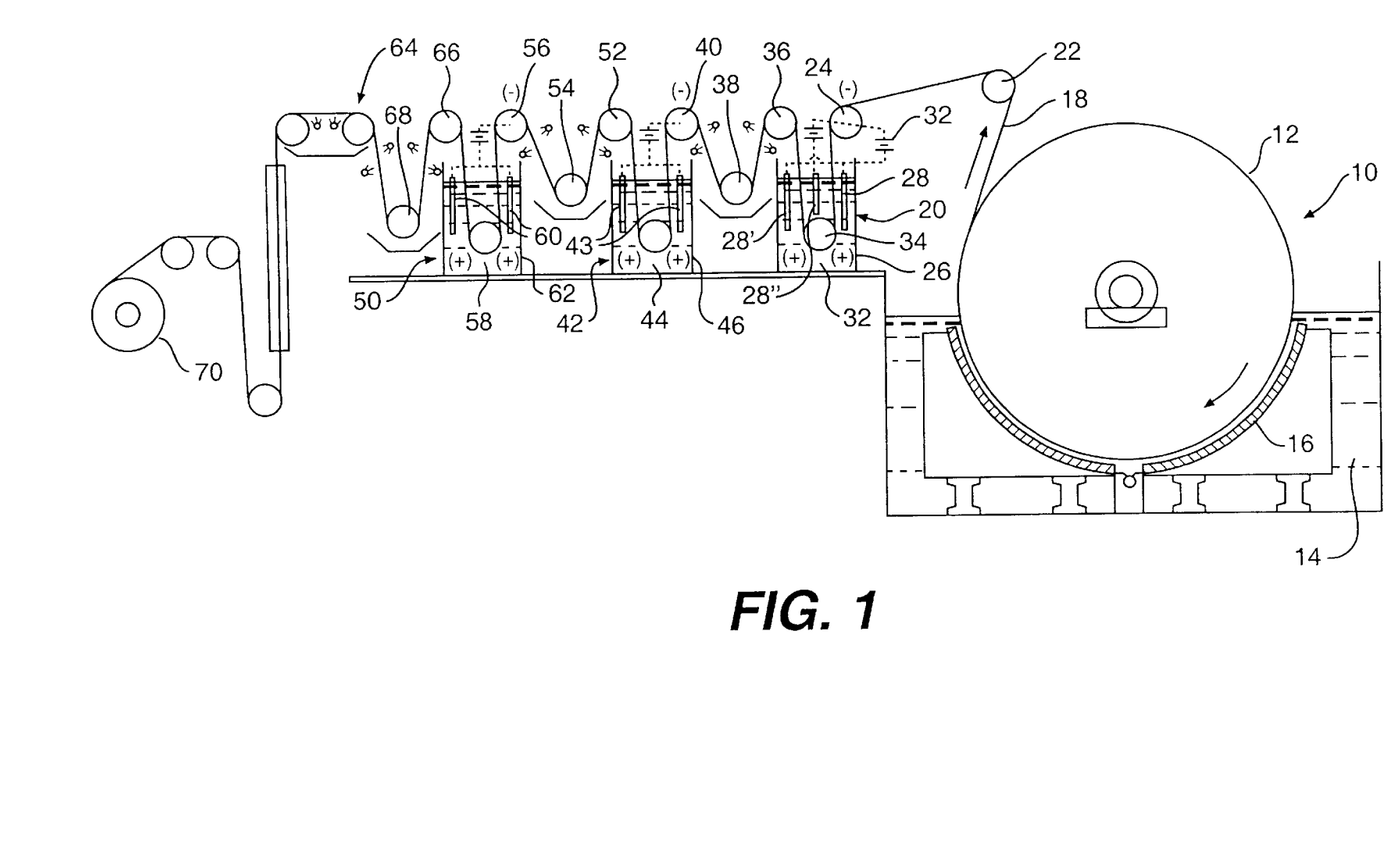
FIG. 1 is illustrative of a preferred apparatus in accordance with the invention for the production of copper foil.

Referring to FIG. 1, raw copper foil may be produced on a conventional rotating drum cathode machine 10 which comprises a rotating drum cathode 12 which is partially immersed in copper sulfate-sulfuric acid electrolyte bath 14 and spaced from a pair of curved anodes 16 spaced from the cathode. An electric current is passed from the anodes through the electrolyte, which is circulated in the machine, to the cathode to electrodeposit copper foil on the surface of the rotating cathode, and raw foil 18 is stripped from the rotating cathode in a continuous manner. The raw foil has a matte surface (on the electrolyte side of the foil) and a shiny surface (on the drum side of the foil). Processes and apparatus for producing such electrodeposited copper foil are well known and need not be described in detail herein. (See, for example, U.S. Pat. No. 5,215,646, which is incorporated herein by reference).

As the raw foil 18 is stripped from the drum cathode 12, it is transferred directly from the drum machine 10 to treater station 20 wherein the micro-roughening copper treatment layer of the present invention is electrodeposited on the matte side, the shiny side, or both sides of the raw foil, as hereinafter described. The raw foil is transferred from the drum machine to the treater station by any suitable transfer means, for example, one or more rollers, such as rollers 22, 24, positioned between the drum machine 10 and treater station 20. Roller 22 is rotated by a driver (not shown), and as it is rotated in pressure contact with foil 18, the foil is stripped from the drum 12 and transferred to the treater station where it contacts and passes over contact roller 24 and into treater tank 26 containing one or more anodes 28, 28', 28''' immersed in electrolyte 30. The foil 18 is rendered cathodic by contact roller 24. An electric current from a power source, for example, a D.C. rectifier 32, is supplied to the treater tank anodes and is passed from the anodes through the electrolyte to the cathode (foil 18) to electrodeposit the micro-roughening copper treatment layer on a surface of the foil.

As shown in FIG. 1, the raw foil is stripped from the drum 12 and transferred by rollers 22 and 24 directly to and through the treater tanks at the same speed at which it is produced and stripped from the drum cathode. In the treater station the foil is passed over contact roller 24, past anode 28, under guide roller 34, past anode 28', and finally over guide roller 36 after it has emerged from the treater tank 26. The matte surface of the foil is opposite anodes 28 and 28', and the treatment layer is therefore electrodeposited on the matte surface.

If the produced foil is intended for use in the fabrication of multi-layer PCB's it is often preferable to also apply the copper treatment layer on the shiny side of the raw foil. In this case a third anode 28'' can be positioned in the treater tank opposite the shiny side of the foil so that an electric current can be passed from anode 28'' through the electrolyte to the foil to electrodeposit a copper treatment layer on the shiny side of the foil.

The electrodeposition conditions which have been found preferable for use in depositing the copper treatment layer of the present invention on the raw copper foil are as follows:

One-Step Micro-Roughening Treatment Plating Parameters and ELECTROLYTE: Copper Sulfate/Sulfuric Acid

|  | Most Preferred | Preferred Range |
|---|---|---|
| Cu (as metal) | 40 g/l | 20–70 g/l |
| H$_2$SO$_4$ | 70 g/l | 60–80 g/l |
| As (as metal) | 350 ppm | 300–400 ppm |

-continued

One-Step Micro-Roughening Treatment Plating Parameters and
ELECTROLYTE: Copper Sulfate/Sulfuric Acid

|  | Most Preferred | Preferred Range |
| --- | --- | --- |
| 2-imidazolidinethione | 25 ppm | 10–100 ppm |
| Cl⁻ | 40 ppm | 10–100 ppm |
| Temperature | 70° F. | 60–80° F. |
| Current Density | 77 A/ft$^2$ | 40–95 A/ft$^2$ |
| Plating Time | 60 sec. | 40–60 sec. |

The foil having the micro-roughening treatment layer applied is rinsed with water after it emerges from the treater station and then transferred by rollers 38 and 40 directly to barrier layer station 42 where a zinc-containing barrier layer is applied. The foil is rendered cathodic by contact roller 40, and as it is passed through barrier layer electrolyte 44 in the tank 46 of the barrier layer station and in front of anodes 48 immersed in the electrolyte, the barrier layer is deposited on the foil. Conditions for applying the barrier layer are well-known and are described, for example, in U.S. Pat. Nos. 3,857,681 and 4,572,768, both of which are incorporated herein by reference. The foil having the applied barrier layer is removed from tank 46, rinsed with water and transferred directly to stainproofing station 50 by rollers 52, 54 and 56. Contact roller 56 renders the foil cathodic, and it is passed through stainproofing electrolyte 58 in front of anodes 60 positioned in tanks 62 where electric current passes from anode 60 through electrolyte 58 to the foil to electrodeposit a chromium-containing stainproofing layer on the barrier layer. The stainproofing electrolyte is an aqueous solution of chromium salts. The method of applying the stainproofing layer is well-known and is described, for example, in U.S. Pat. Nos. 3,883,716 and 3,625,844, both of which are incorporated herein by reference.

After application of the stainproofing layer, the foil is thus given a final rinse and transferred directly to chemical adhesion promoter station 64 by rollers 66 and 68 where an adhesion promoter, or coupling agent, for example, glycidoxy silane, is sprayed on the foil. Such adhesion promoters are well known and are described, for example, in U.S. Pat. No. 5,215,646, which is incorporated herein by reference. Thereafter, the coating of adhesion promoter is dried and the finished foil is coiled into roll 70.

EXAMPLES

Case 1

Figure 3A:
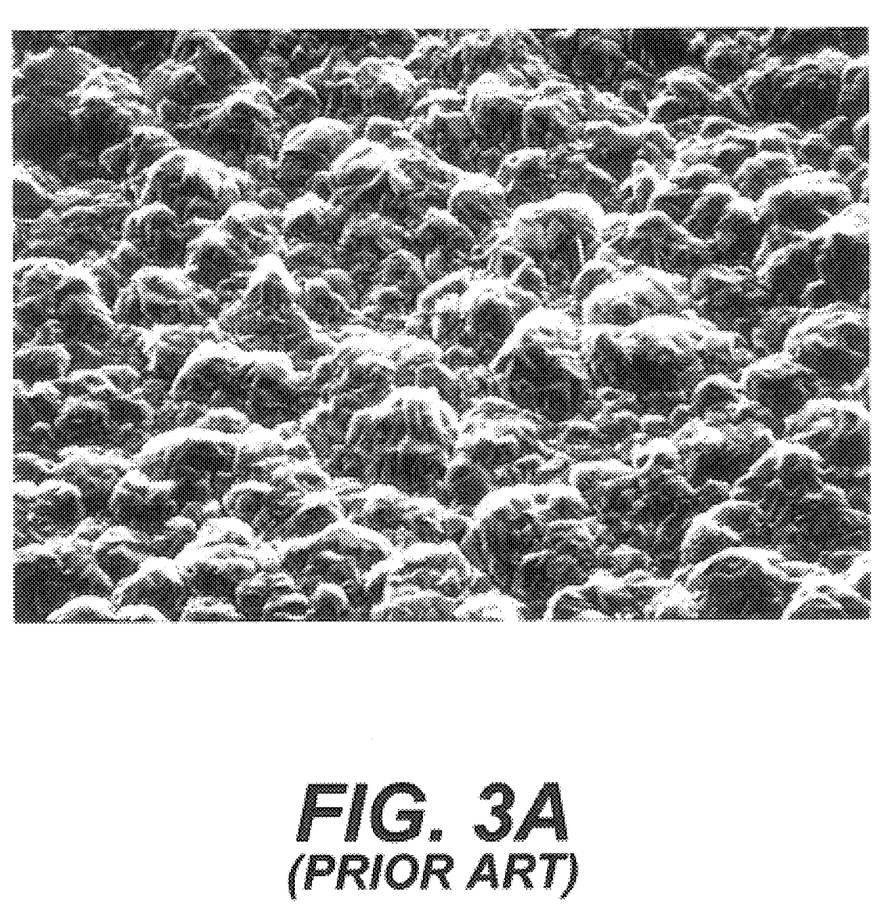
FIGS. 3A, 3B and 3C are microphotographs of, respectively, the matte surface of a raw copper foil, the surface of prior art bonding treatment deposited on the matte surface of the raw foil, and the surface to the micro-roughening treatment of the present invention deposited on the matte surface of the raw copper foil (each 1000×@45°).
Figure 3B:
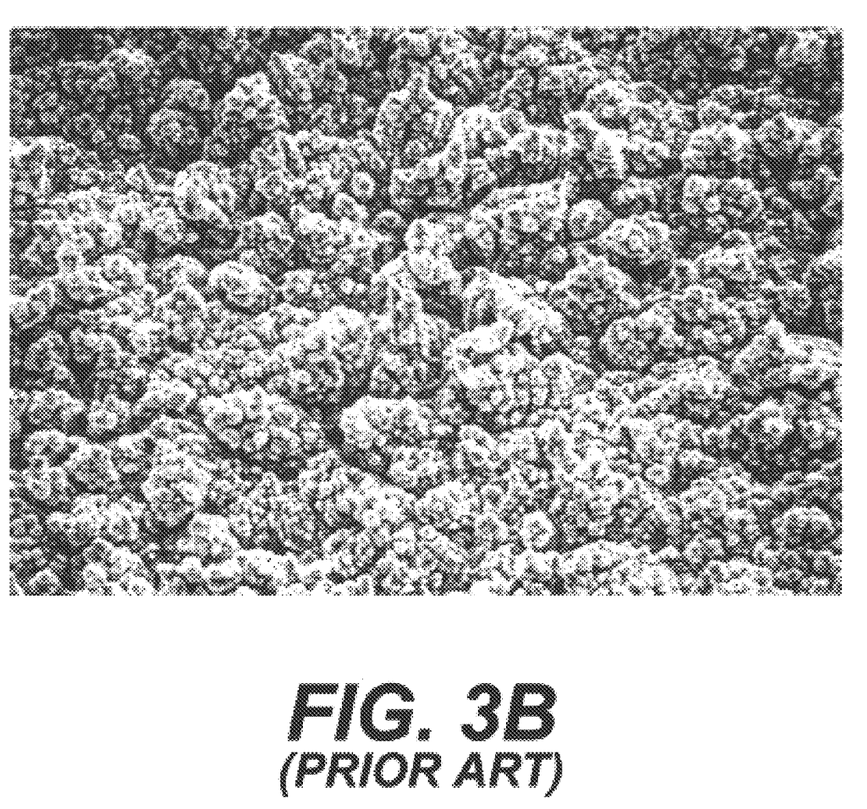

A web of one ounce base foil produced on a conventional rotating drum cathode machine using an electrolyte and electroplating condition typical in the industry was subjected to the application on the matte surface of a bonding treatment by passing it through a conventional multi-tank treater machine to deposit dendritic and gilding layers of copper thereon. FIG. 3A is a photomicrograph of the matte surface of the raw foil, and FIG. 3B is a photomicrograph of the raw foil having the treatment, barrier, strain proofing and adhesion promoter applied thereon.

Case 2

Figure 3C:
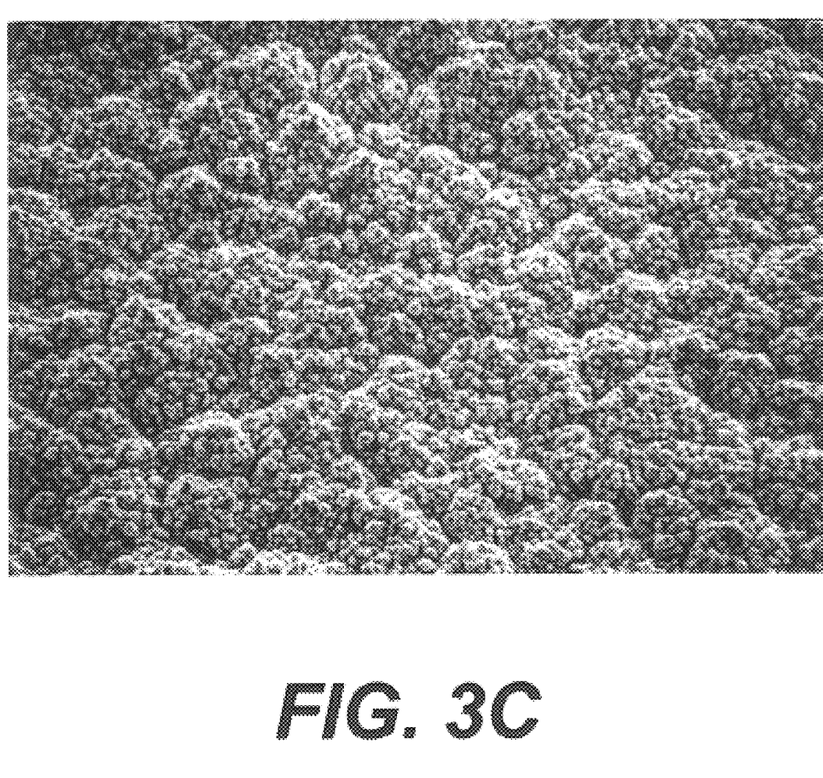

The raw foil produced on the same drum machine under the same conditions as in Case 1 was then guided through the sequence of one-step micro-roughening treatment station, barrier layer station, stain proof station and the application of chemical adhesion promoter (spray of glycidoxy silane). The electrodeposition conditions used in applying the micro-roughening treatment were as shown below: The matte surface of the resulting foil is shown in FIG. 3C.

The Electrolyte and the Electrodeposition
Parameters for Micro-Roughening Steps were:

| ELECTROLYTE: Copper Sulfate/Sulfuric Acid | |
| --- | --- |
| Cu (as metal) | 40 g/l |
| H$_2$SO$_4$ | 70 g/l |
| As (as metal) | 350 ppm |
| 2-Imidazolidinethione | 25 ppm |
| Cl⁻ | 40 ppm |
| Temperature | 70° F. |
| Current Density | 77 A/ft$^2$ |
| Plating Time | 60 sec. |

The foils represented in Case 1 and Case 2 were laminated to FR-4 epoxy prepreg and the peel strength of both foils were tested.

The peel strength in Case 1 was 11.4 lbs./in. and the Case 2, 11.6 lbs./in. While the bend in both cases was practically identical, the roughness of the foil produced according to the invention was 270 microinches, while the roughness of the foil treated according to the prior art method was 380 microinches (the roughness of base foil was in both cases 240 microinches).

Obviously, the low micro-roughness of the treated side is preferable, since such foil produced PCB's endowed with better dielectric properties, and in addition, is easier to process (lower etching times, better line definition).

We believe that our observations and findings are consistent with the mass transfer and hydrodynamics interpretations which link the conditions of electrodeposition with the type of electrogrowth and the structure and distribution of the deposits. The mechanism of forming the treatment of the present invention can be compared to that of the prior art treatment as follows.

Figure 2A:
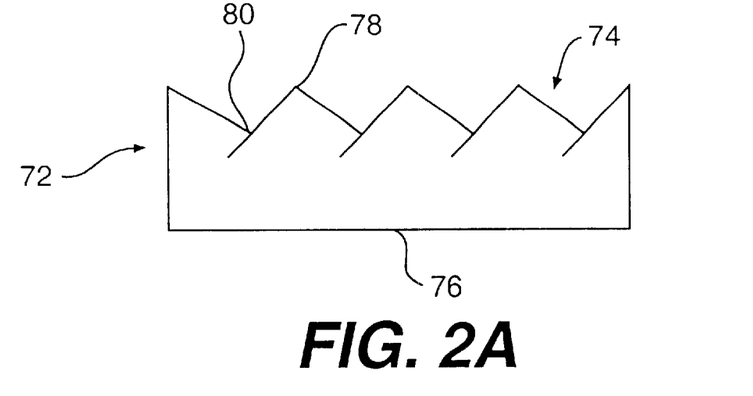
FIGS. 2(A)–2(C) illustrate, respectively, the topographies of raw foil, raw foil with conventional treatment applied and raw foil with the micro-roughening copper treatment layer of the present invention applied.

FIG. 2A depicts typical raw 72 foil having a matte side 74 and a shiny side 76, with micro-peaks 78 and micro-valleys 80 formed on the surface of the matte side.

The traditional treatment process accentuates roughness by directing more deposit to the peaks of the matte side of the base foil than to the valleys since the current density is highest at the peaks--distribution of the deposit follows the distribution of the current density over the micro-profile of the base foil.

Plating conditions in the dentritic (powdery) station of the prior art treater machine combined with hydrodynamic conditions (high speed of the foil) conspire together to create a high degree of variation of concentration polarization over the micro-profile (peaks 78 and valleys 80) of the matte side of base foil. High speed of the foil sweeps away electrolyte adhering to the foil which makes a diffusion layer fairly thick; we believe that the thickness of the diffusion (nerst) layer is about 10 microns. Since the difference from peaks to valley in the case of one ounce foil is about 6 microns, which is the same order of magnitude. The rate of deposition is high, due to the use of high current density.

Since the current density is within the limiting current density, the concentration of copper ions approaches zero at all points of the micro-profile. The concentration gradient, which is a driving force for the diffusion, is larger over the peaks than over the valleys, therefore ions of copper diffuse more rapidly to peaks 78 than to the valleys 80 and the deposit grows more rapidly on peaks.

Figure 2B:
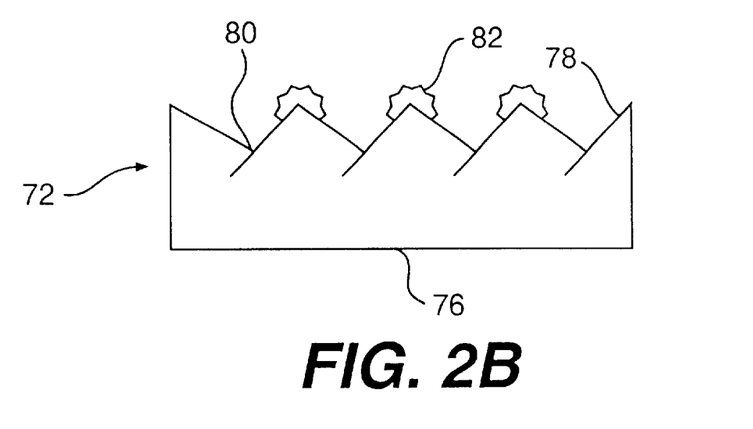

Moreover, the very short deposition time does not give a chance for the treatment particles 82 to be deposited in the valleys, as shown in FIG. 2B.

Figure 2C:
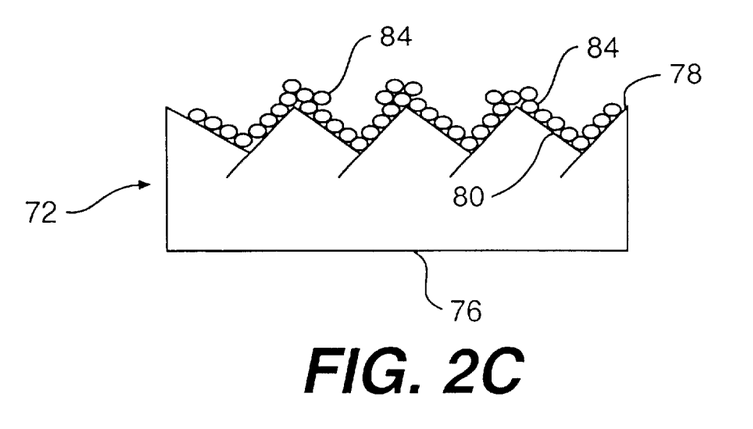

In sharp contrast, the mass transfer and hydrodynamic aspects of the present one-step micro-roughening treatment are very different, as may be seen in FIG. 2C.

The low speed of the moving web of foil allows the diffusion layer to be much thicker.

The low current density (substantially below the limiting current density), and relatively high copper concentration magnify the effect of the low foil speed. We believe that the thickness of diffusion layer is about 100 microns. Since the distance from peaks to valleys is only about 6 microns, relatively little compared to 100 microns, the distances from the outer perimeter of the diffusion layer to the peaks and to the valleys are almost the same.

Consequently, the distribution of treatment particles 84 over the micro-profile of the matte side of the base foil is very even (FIG. 2C). Since the treatment particles are deposited with a low current density over long deposition time, the treatment particles are smaller, compact and sharp, offering good bondability and relatively low profile. A relatively high copper concentration in the electrolyte contributes toward this effect.

The effects of the above-specified copper concentration, current density and plating time, in combination, are very important to attaining the goal of achieving the desideratum of electrodeposition of highly bondable treatment in our one-step process. Also, the participation of 2-imidazolidinethione ($C_3H_6N_2S$) is important in the concept and execution of the present invention. This substance, prepared by the action of ethylenediamine upon carbon disulfide, is commercially available.

2-imidazolidinethione is a strong organic inhibitor that combines nitrogen and sulfur functions in its molecule and acts as an addition agent in the electrodeposition of the present one-step micro-roughening treatment.

In order to deposit treatment particles, not only on the peaks, but also in the valleys, it is necessary to provide a "leveling effect" that helps to produce the uniform distribution of the present treatment. The function of 2-imidazolidinethione is the one of a leveler. It adsorbs preferentially on the peaks of matte side of base foil and inhibits the deposition in that region and directs it to the valley. This inhibiting power is destroyed on the surface by a chemical reaction which releases it, setting up a concentration gradient close to the surface.

We believe that 2-imidazolidinethione forms a complex with copper and inhibits preferential deposition on the peaks by a "filming" action, thus helping to achieve more uniform distribution of treatment particles by improving the electrolyte's microthrowing power.

It is well known that certain organic addition agents influence electro-growth, probably by processes of absorption or selective blocking of growth sites and thus are able to alter growth patterns and microstructures of the electrodeposits. However, we believe that 2-imidazolidinethione its influence is unusually well-suited for use in the present process to influence the distribution and micro-structure of treatment particles, because it combines the ability to absorb by virtue of its attraction to the electronegative surfaces with the ability to form complex compounds with copper due to the presence of ammonia nitrogen in its molecule.

Having described preferred embodiments of our invention, it is to be understood that variations and modification thereof falling within the spirit of the invention may become apparent to those skilled in the art, and the scope of the invention is to be determined by the appended claims and their equivalents.

What is claimed is:

1. A process for the production of electrodeposited copper foil having an electrodeposited copper bonding treatment on a surface of the foil for enhancing the bondability of the foil to a polymeric substrate, which comprises:
    (a) passing a web of raw electrodeposited copper foil directly from a rotating drum cathode machine to a treater tank containing an anode immersed in a copper sulfate-sulfuric acid electrolyte;
    (b) passing the copper foil through the electrolyte while passing an electric current from a direct current power source to the anode and through the electrolyte to the copper foil to electrodeposit a single micro-roughening copper treatment layer on at least one surface of the copper foil, the treatment layer being electrodeposited under electrodeposition conditions which include a current density of from about 40 to about 100 A/ft2 and a plating time of greater than 30 sec.

2. The process of claim 1, wherein the plating time is from about 40 to about 60 sec and the electrolyte contains about 20–70 g/l of copper and about 10–100 ppm of 2-imidazolidinethione.

3. The process of claim 1, wherein the electrolyte contains about 20–70 g/l of copper, about 300–400 ppm arsenic, about 10–100 ppm chloride ions, about 10–100 ppm of 2-imidazolidinethione and about 60–80 g/l sulfuric acid, and the plating conditions include a temperature of about 60–80° F., a current density of about 40–95 A/ft$^2$ and a plating time of about 40–60 sec.

4. The process of claim 1, wherein of the copper foil has a matte surface on one side of the foil and a shiny surface on an opposite side and the treatment layer is electrodeposited on the micropeaks and microvalleys of the matte surface.

5. The process of claim 4, wherein the treatment layer is electrodeposited on each of the matte surface and the shiny surface.

6. The process of claim 1, further including passing the copper foil having the copper treatment layer deposited thereon from the treater tank directly to a barrier layer tank, electrodepositing a zinc-containing barrier layer on the electrodeposited copper treatment layer in the barrier layer tank, passing the foil having the barrier layer thereon from the barrier layer tank directly to a stainproofing tank, and electrodepositing a chromium-containing stainproofing layer on the barrier layer.

7. The process of claim 6, wherein said single copper treatment layer is electrodeposited on a matte side of the raw foil, the barrier layer is electrodeposited on said single copper layer, and a second copper treatment layer is electrodeposited on a shiny side of the raw copper foil.

8. The process of claim 1, wherein the raw foil is electrodeposited on a rotating drum cathode, stripped from the drum-cathode and continuously passed from the drum cathode to the treater tank at a speed which is the same as the speed at which the raw foil is stripped from the rotating drum cathode.

9. The process of claim 1, wherein the copper foil has a matte surface on one side of the foil and a shiny surface on an opposite side thereof, and the treatment layer is electrodeposited on the shiny surface.

* * * * *